(12) United States Patent
Kim (10) Patent No.: US 6,211,709 B1
(45) Date of Patent: Apr. 3, 2001

(54) PULSE GENERATING APPARATUS

(75) Inventor: Kang Yong Kim, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/342,524

(22) Filed: Jun. 29, 1999

(30) Foreign Application Priority Data

Jun. 29, 1998 (KR) .................................................. 98-24818

(51) Int. Cl.[7] .................................................. H03K 3/017
(52) U.S. Cl. ........................ 327/172; 327/173; 327/174; 327/175; 327/298
(58) Field of Search .................................. 327/172, 173, 327/174, 175, 298, 291

(56) References Cited

U.S. PATENT DOCUMENTS

| | | | |
|---|---|---|---|
| 4,578,597 | * 3/1986 | Soneda et al. | 307/265 |
| 4,626,705 | 12/1986 | Raver | 307/269 |
| 5,151,164 | 9/1992 | Blanchard et al. | 204/182.1 |
| 5,245,573 | 9/1993 | Nakaoka et al. | 365/189.05 |
| 5,349,245 | 9/1994 | Hughes et al. | 307/353 |
| 5,608,667 | 3/1997 | Osawa | 365/145 |
| 5,675,560 | 10/1997 | Ogino | 369/32 |

* cited by examiner

*Primary Examiner*—Timothy P. Callahan
*Assistant Examiner*—Cassandra Cox
(74) *Attorney, Agent, or Firm*—Jacobson, Price, Holman & Stern, PLLC (57) ABSTRACT

A pulse generating apparatus efficiently generates a pulse signal by receiving a control signal. A voltage level controller 20 receives a control signal and outputs a certain voltage through a node N0. A output level variation element C is placed between a node N0 and a node N1. A switching element 30 applies a high voltage Vcc to the node N1. A switching element 40 applies a low voltage Vss to the node N1. The pulse is generated by a logic operation of the control signal and a voltage on a node N0.

10 Claims, 12 Drawing Sheets

Fig.3c (prior art) Output

Fig.5c (prior art) Out put

PULSE GENERATING APPARATUS

BACKGROUND OF THE INVENTION

1. Field of the Invention

This invention relates to a pulse generating apparatus applied to semiconductor circuits, and more particularly to a pulse generating apparatus generating a pulse at an output terminal in response to conditions of a control signal and an input signal.

2. Description of the Prior Art

Figure 1:
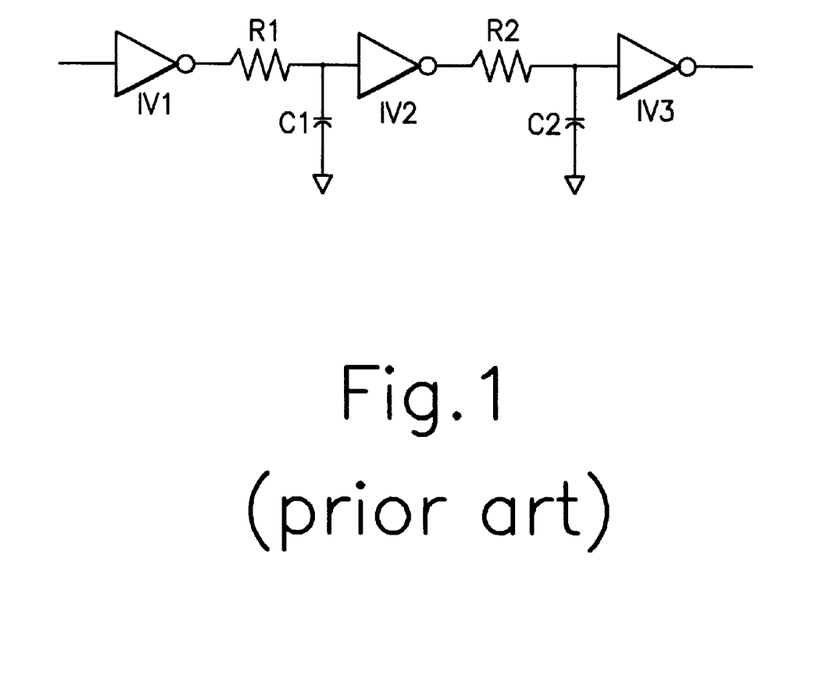
FIG. 1 is a circuit diagram illustrating a general delay circuit.

A related art of a pulse generating apparatus typically includes a delay circuit having a plurality of inverters IV1 to IV3 which are connected in series to each other by using resistors R1 and R2 and capacitors C1 and C2, so that an output signal with an inphase or antiphase to an input signal is output as depicted in FIG. 1 (an antiphase signal is output in FIG. 1).

Figure 2:
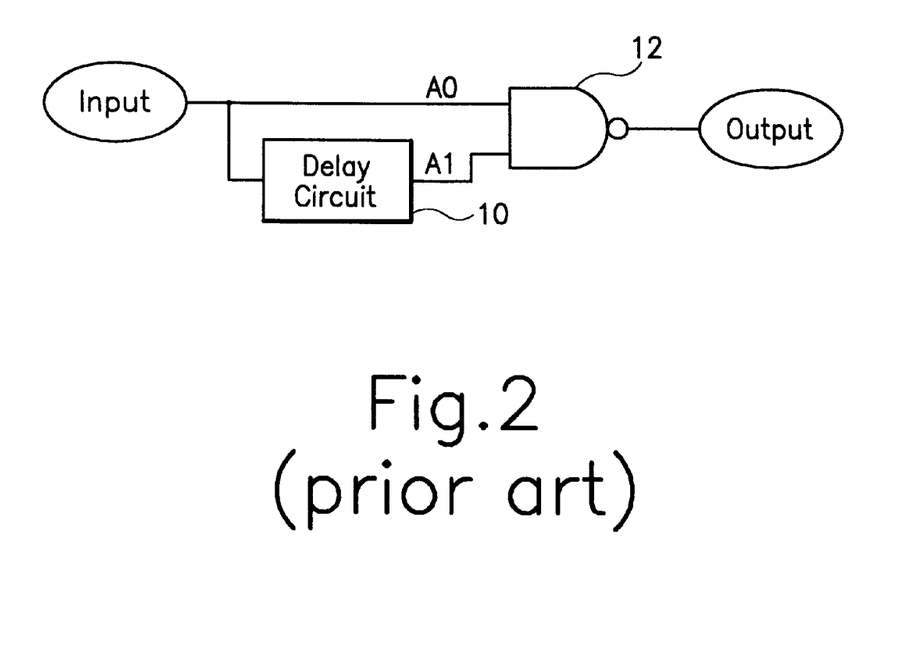
FIG. 2 is a block diagram illustrating the related art of a pulse generating apparatus.

As depicted in FIG. 2, a related art of the pulse generating apparatus having the delay circuit includes a delay circuit 10 for delaying an external input signal A0 during a constant time, and a NAND gate 12 for performing a NAND operation by receiving both the external input signal A0 and an output A1 (delayed external signal) from the delay circuit 10.

Figure 3A:
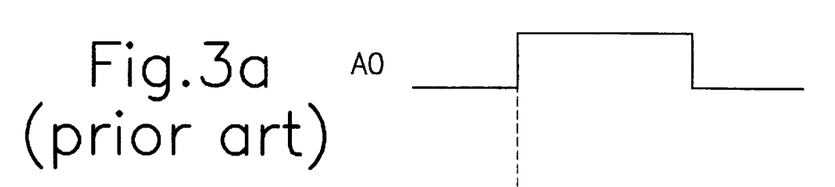
FIG. 3a to FIG. 3c are waveform diagrams illustrating input/output signals generated from the pulse generating apparatus of FIG. 2.
Figure 3B:
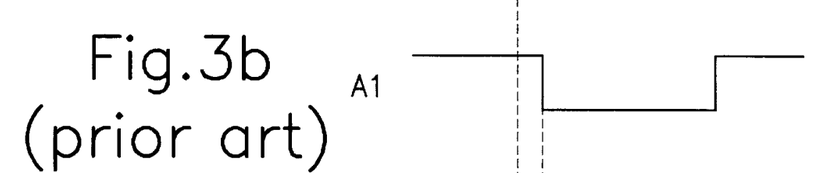
Figure 3C:
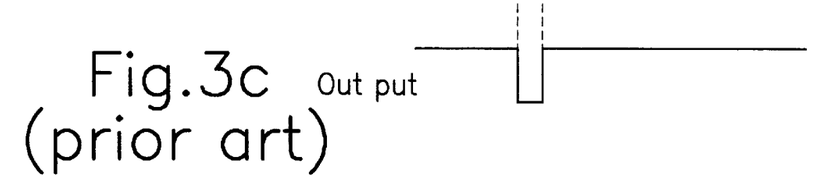

According to the related art of the pulse generating apparatus, if the input signal A0 shown in FIG. 3a is inputted to one terminal of the NAND gate 12, and an opposite and delayed signal A1 through the delay circuit 10 as shown in FIG. 3b is inputted to the other terminal of the NAND gate 12, a logic low pulse is generated when the input signal A0 of a low level is changed to a high level as the result of a logical condition for the input signal combination in the NAND gate 12, as shown in FIG. 3c.

Figure 4:
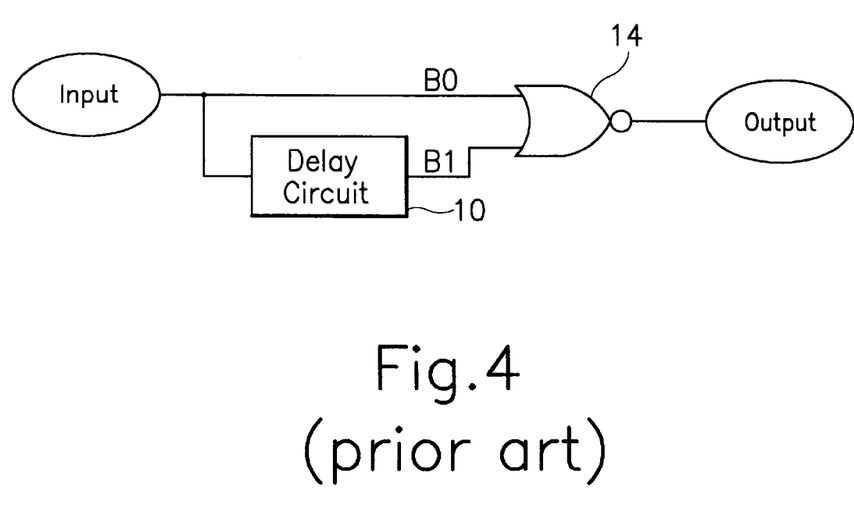
FIG. 4 is a block diagram illustrating the other related art of a pulse generating apparatus.

FIG. 4 is a circuit diagram showing the other related art of a pulse generating apparatus. As depicted in FIG. 4, the other related art of the pulse generating apparatus includes a delay circuit 10 for delaying an input signal B0 during a constant time, and a NOR gate 14 for performing a NOR gate operation upon receiving the input signal B0 and the output signal B1 from the delay circuit 10.

Figure 5A:
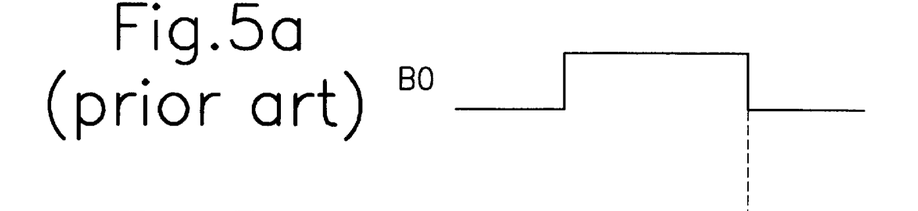
FIG. 5a to FIG. 5c are waveform diagrams illustrating input/output signals generated from the pulse generating apparatus of FIG. 4.
Figure 5B:
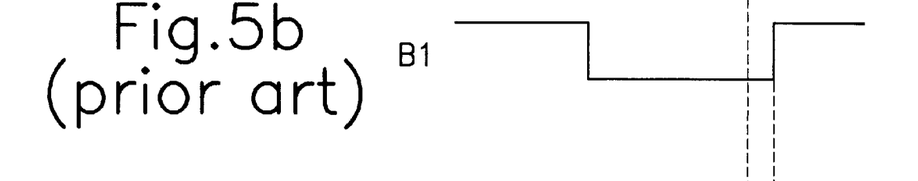
Figure 5C:
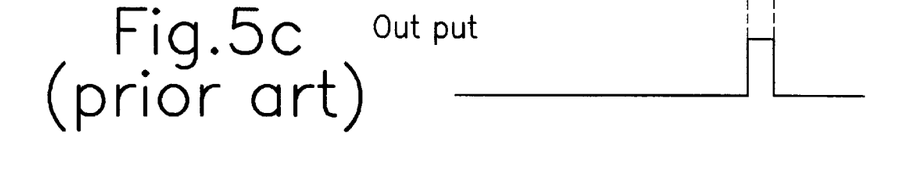

According to the other related art of the pulse generating apparatus, the input signal B0 as shown in FIG. 5a is inputted to a terminal of the NOR gate 14, and a delayed signal B1 with antiphase as shown in FIG. 5b is inputted to the other terminal of the NOR gate 14, thereby generating a logic high pulse when the input signal B0 of a high level is changed to a low level as the result of the logical condition for the input signal combination in the NOR gate 14 as shown in FIG. 5c.

As described above, there is a problem in that the related art of the pulse generating apparatus has been used for connecting additional capacitors having too large an area to extend the width of a required pulse signal, and other gates have been required to control the width of the pulse signal. Accordingly, the total area of the related art of the pulse generating apparatus may be increased as a result of the above reasons.

SUMMARY OF THE INVENTION

Therefore, the present invention has been devised to solve the problem involved in the prior art, and provides a pulse generating apparatus that efficiently generates a pulse embodied on a relatively small area in contrast to that of the related arts.

In order to achieve an objective of the present invention, there is provided a pulse generating apparatus outputting a pulse by receiving a first control signal, the apparatus comprising a voltage level control means for receiving said first control signal and outputting a first voltage through a first node; an output level variation means placed between said first node and a second node; a first switching means for applying a high voltage to said second node; and a second switching means for applying a low voltage to said second node; wherein said pulse is generated by a logical operation of said first control signal and a voltage at said first node.

In order to achieve the above objective, there is provided a pulse generating apparatus outputting a pulse by receiving a first control signal, the apparatus comprising a voltage level control means for receiving said first control signal and outputting a first voltage through a first node; an output level variation means placed between said first node and a second node; a first switching means for applying a voltage at said first node to said second node; and a second switching means for applying a low voltage to said second node, wherein said pulse is generated by a logical operation of said first control signal and said voltage at said first node.

In order to achieve the above objective, there is also provided a pulse generating apparatus outputting a pulse by receiving a first control signal, the apparatus comprising a voltage level control means for receiving said first control signal and outputting a first voltage through a first node; an output level variation means placed between said first node and a second node; a first switching means for applying a high voltage to said second node; and a second switching means for applying a voltage at said first node to said second node, wherein said pulse is generated by a logical operation of said first control signal and said voltage at said first node.

BRIEF DESCRIPTION OF THE DRAWINGS

The above objective and other features of the present invention will become more apparent by describing the preferred embodiments thereof with reference to the accompanying drawings, in which.

DETAILED DESCRIPTION OF THE PREFERRED EMBODIMENT

Now, the preferred embodiments of the present invention configured as above are explained in detail in connection with the attached drawings.

Figure 6:
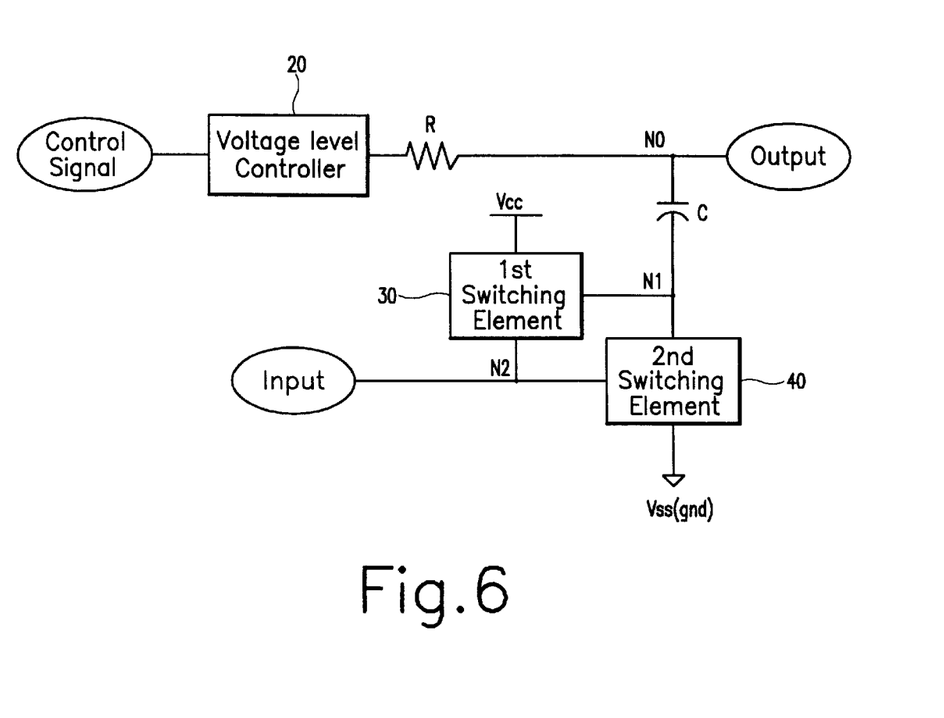
FIG. 6 is a block diagram illustrating a pulse generating apparatus according to a first preferred embodiment of the present invention.
Figure 7A:
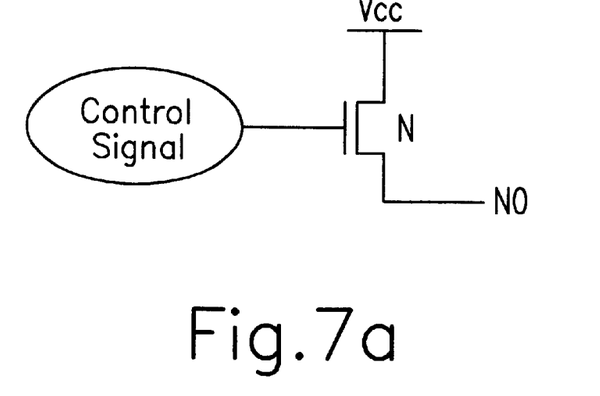
FIG. 7a to FIG. 7i are block diagrams illustrating voltage level controllers depicted in FIG. 6.
Figure 7B:
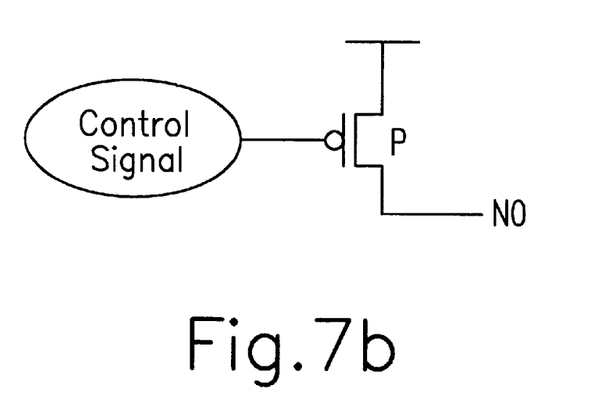
Figure 7C:
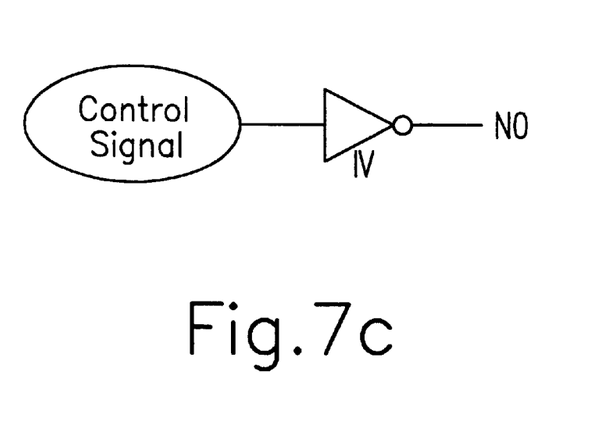

FIG. 6 is a block diagram illustrating a pulse generating apparatus according to a first preferred embodiment of the present invention. In FIG. 6, the voltage level controller 20 outputs inphase or antiphase signal against the control signal to an output terminal NO in response to the control signal. The voltage level controller 20 is embodied in various types that use an NMOS transistor, coupled between a power source voltage terminal Vcc and the output terminal NO for switching on/off in accordance with the control signal as depicted in FIG. 7a, or a PMOS transistor, coupled between the power source voltage terminal Vcc and the output terminal NO for switching on/off in accordance with the control signal as depicted in FIG. 7b, or an inverter IV as depicted in FIG. 7c.

Figure 7D:
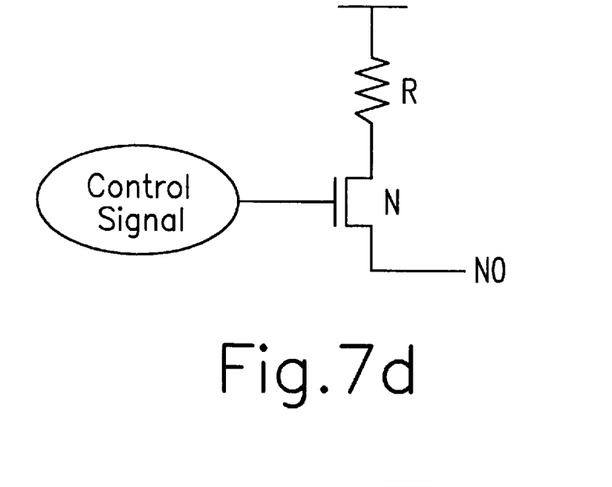
Figures 7E, 7F:
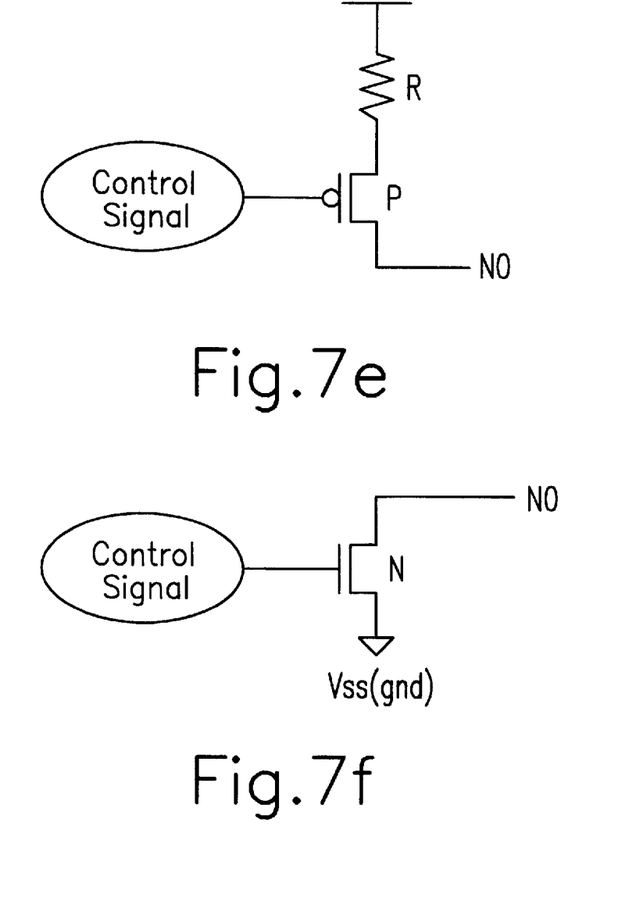

Further, the voltage level controller 20 is embodied as an NMOS transistor N, coupled between the power source voltage terminal Vcc and the output terminal NO through the medium of resistor R for switching on/off in accordance with the control signal as depicted in FIG. 7d, or a PMOS transistor P, coupled between the power source voltage terminal Vcc and the output terminal NO through the medium of resistor R for switching on/off in accordance with the control signal as depicted in FIG. 7e.

Figure 7G:
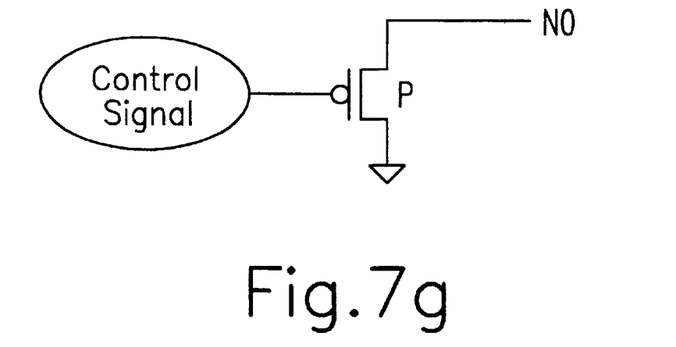
Figure 7H:
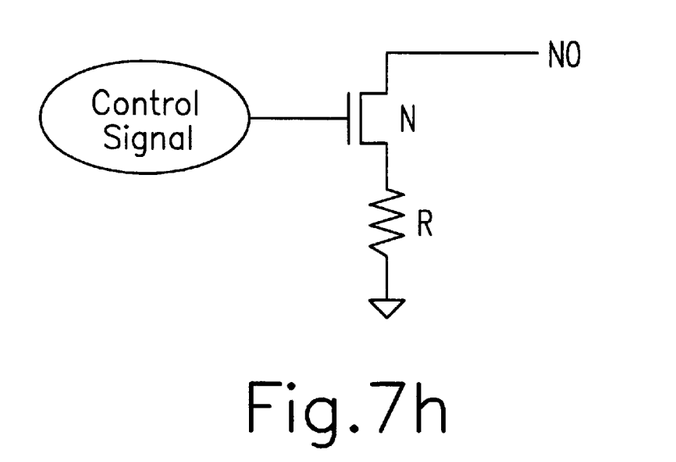
Figure 7I:
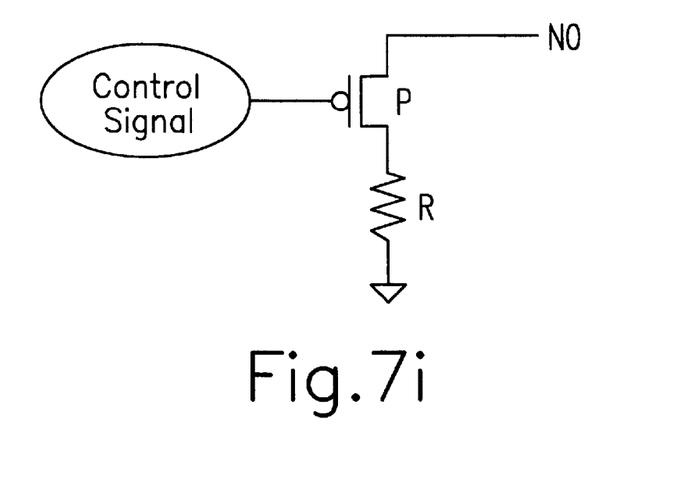

Furthermore, the voltage level controller 20 is embodied as an NMOS transistor N, coupled between an output terminal NO and a ground voltage terminal Vss for switching on/off in accordance with the control signal as depicted in FIG. 7f, or a PMOS transistor P, coupled between an output terminal NO and a ground voltage terminal Vss for switching on/off in accordance with the control signal as depicted in FIG. 7g, an NMOS transistor N as the MOS device, coupled between an output terminal NO and a ground voltage terminal Vss through the medium of resistor R, for switching on/off in accordance with the control signal as depicted in FIG. 7h, or a PMOS transistor P, coupled between an output terminal NO and a ground voltage terminal Vss through the medium of resistor R for switching on/off in accordance with the control signal as depicted in FIG. 7i.

In FIG. 6, the resistor R and the capacitor C generate a pulse signal and control the width of a pulse signal. At this stage, the width of the pulse signal may be enlarged by the increase of both the resistance value of the resistor R connected between the voltage level controller 20 and the output terminal NO and a capacitance value of the capacitor C connected between the output terminal NO and the ground voltage terminal Vss, because of the increase of the time constant.

Here, the capacitor C is connected between two nodes N0 and N1. In general, the capacitor C is made of a MOS transistor.

In FIG. 6, the first switching element 30 and the second switching element 40 are switching means for generating a potential difference between two ends of the capacitor C by receiving the input signal through an input signal terminal.

The switching means can be embodied by various types in the following manner.

Figure 8A:
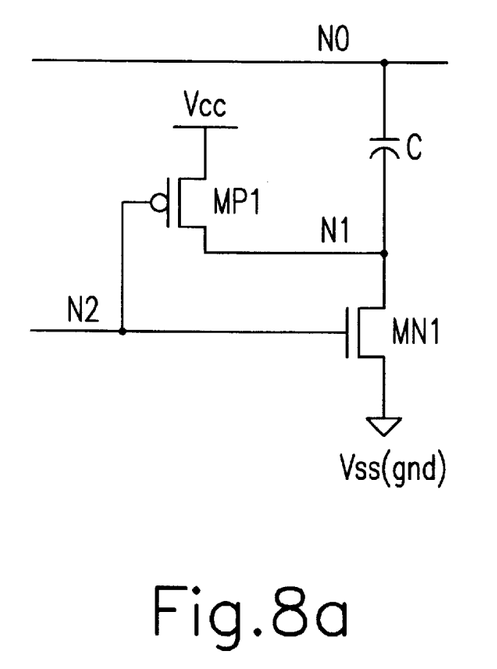
FIG. 8a to FIG. 8f are block diagrams illustrating first and second switching elements depicted in FIG. 6.

FIG. 8a, a is a block diagram illustrating the first and second switching elements according to a preferred embodiment of the present invention.

Figure 8B:
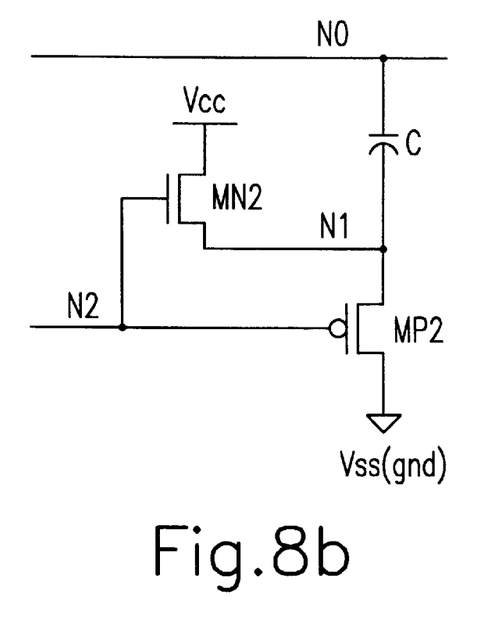

In FIG. 8a, the switching element includes a PMOS transistor MP1 as the first switching element which is connected between the power source voltage terminal Vcc and the terminal node N1 of the capacitor C and performs the switching on/off operation by the input signal, and a NMOS transistor MN1 as the second switching element which is connected between the terminal node N1 of the capacitor C and a ground voltage terminal Vss and performs the switching on/off operation by the input signal. Also, as shown in FIG. 8b, the switching element includes an NMOS transistor MN2 as the first switching element which is connected between a power source voltage terminal Vcc and an terminal node N1 of the capacitor C and performs the switching on/off operation in response to the input signal, and a PMOS transistor MP2 as the second switching element which is connected between the terminal node N1 of the capacitor C and a ground voltage terminal Vss and performs the switching on/off operation in response to the input signal.

Figure 8C:
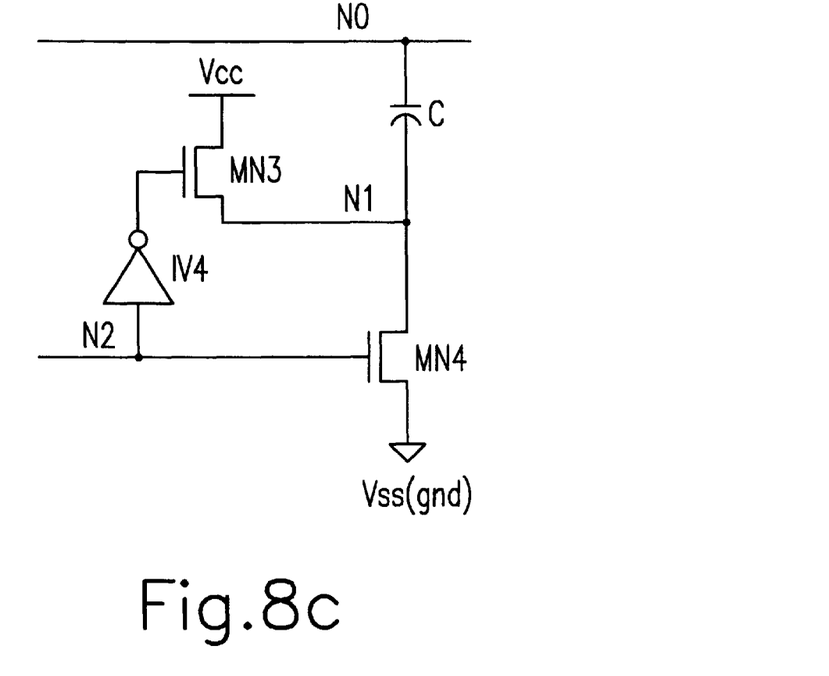

Further, in FIG. 8c, the switching element includes an NMOS transistor MN3 as the first switching element which is connected between a power source voltage terminal Vcc and the terminal node N1 of the capacitor C and performs the switching on/off operation by the input signal inverted by an inverter IV4, and an NMOS transistor MN4 as the second switching element which is connected between the terminal node N1 of the capacitor C and a ground voltage terminal Vss and performs the switching on/off operation in response to the input signal.

Figure 8D:
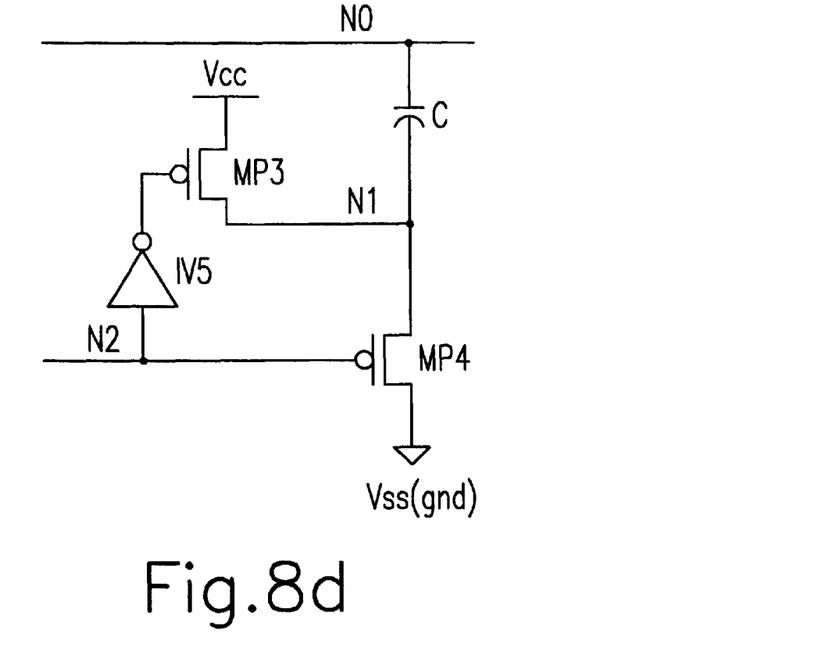

Furthermore, in FIG. 8d, the switching element includes a PMOS transistor MP3 as the first switching element which is connected between a power source voltage terminal Vcc and the terminal node N1 of the capacitor C and performs the switching on/off operation by the input signal inverted by an inverter IV5, and a PMOS transistor MP4 as the second switching element which is connected between the node N1 of the capacitor C and a ground voltage terminal Vss and performs the switching on/off operation in response to the input signal.

Figure 8E:
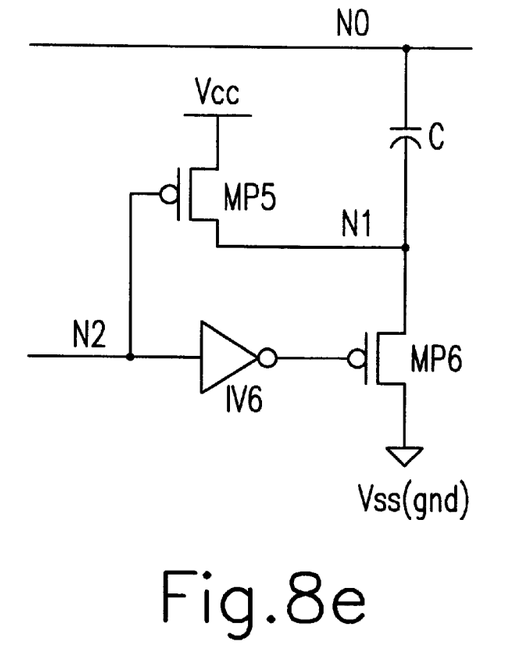

Furthermore, as depicted in FIG. 8e, the switching element includes a PMOS transistor MP5 as the first switching element which is connected between a power source voltage terminal Vcc and the node N1 of the capacitor C and performs the switching on/off operation by the input signal, and a PMOS transistor MP6 as the second switching element which is connected between the node N1 of the capacitor C and a ground voltage terminal Vss and performs the switching on/off operation in response to the input signal inverted by an inverter IV6.

Figure 8F:
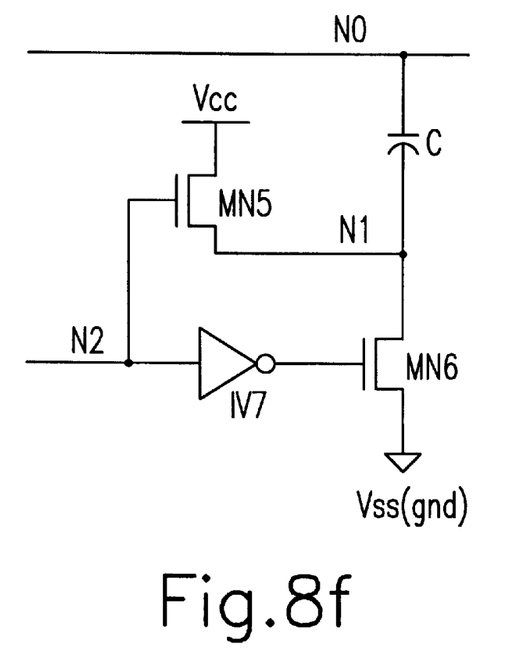

Furthermore, as depicted in FIG. 8f, the switching element includes a NMOS transistor MN5 as the first switching element which is connected between a power source voltage terminal Vcc and the node N1 of the capacitor C and performs the switching on/off operation by the input signal, and an NMOS transistor MN6 as the second switching element which is connected between the node N1 of the capacitor C and a ground voltage terminal Vss and performs the switching on/off operation in response to the input signal inverted by an inverter IV7.

Now, the operation of the pulse generating apparatus according to the first preferred embodiment of the present invention will be described as follows.

In the first embodiment of the present invention, assuming that when the control signal becomes a low level, the output terminal N0 becomes a high level by the voltage level controller 20. And, assuming that when the control signal becomes a high level, the output terminal No becomes a low level.

When the input signal becomes a high level (i.e., the node N2 is a high level), the first switching element 30 is switched-off and the second switching element 40 is switched-on. Therefore, the node N1 becomes a low level.

Meanwhile, when the input signal becomes a low level (i.e., the node N2 is a low level), the first switching element 30 is switched-on and the second switching element 40 is switched-off. Therefore, the node N1 becomes a high level.

Wherein, in general, the high level means the power source voltage Vcc and the low level means Vss or ground voltage gnd, respectively.

In the first embodiment of the present invention, two kinds of pulses are generated in accordance with an initial condition which is determined by the control signal.

In the first case, as set by the control signal in the initial stage, when the output terminal (i.e., the Node N0) is a high level, a low pulse is generated at the node N0 by the input signal.

Thus, the node N0 and the node N1 become a high level state with no existing electrical potential differences between each other, because the switching element 30 is switched-on, and the second switching element 40 is switched-off by the input signal (i.e., the low level signal).

If the input signal is changed from a low level to a high level, the node N1 becomes a low level since the first switching element 30 is switched-off and the second switching element 40 is switched-on. Then, the node N0 also becomes a low level by the capacitor C, and the node N0 is instantly changed from a low level to a high level again by the voltage level controller 20 since the current control signal is a low level to generate the pulse at the output terminal connected to the node N0.

Here, the more the resistance value of the resistor R which is located between the node N0 and the voltage level controller 20 and the capacitance of the capacitor C are increased, the more the pulse width is widened since much time is required to achieve a high level state at the node N0 of the capacitor.

Under these circumstances, if the input signal returns to a low level from a high level, the node N0 and the node N1 maintain a high level state with no existing electrical potential differences between each other since the present state returns to the initial state where the first switching element 30 is switched-on and the second switching element 40 is switched-off. Accordingly, in the first case, the pulse is generated when the input signal rises.

Here, if an odd number of inverter(s) is(are) coupled between the node N2 and the input terminal, the state of the node N2 caused by the input signal is opposite to the above first embodiment example. The switching-on/off operation of the switching elements 30 and 40 according to the input signal is also opposite. Accordingly, the pulse is generated when the input signal falls from a high level to a low level. For only the first case, there is no problem in connecting the ground voltage terminal instead of the control signal to the first switching element 30.

In the second case, if it is set that the output terminal (i.e., the node N0) is a low level by the control signal at the initial stage, a high pulse is generated at the node N0 by the input signal. Thus, the first switching element 30 is switched-off by the input signal (i.e.,the high level signal) and the second switching element 40 is switched-on, so that both the node N0 and the node N1 become a low level with no existing electrical potential differences.

At this stage, if the input signal is changed from a high level to a low level, the node N1 becomes a high level since the first switching element 30 is switched-on and the second switching element 40 is switched-off. Then, the node N0 also becomes a high level by the capacitor C, but the node N0 instantly becomes a low level again by the voltage level controller 20 in order to generate a pulse at the output terminal connected to the node N0 since the present control signal is a high level.

Here, the more the resistance value of the resistor R which is located between the node N0 and the voltage level controller 20 and the capacitance of the capacitor C are increased, the more the pulse width is widened since much time is required to achieve a low level state at the node N0 of the capacitor.

Under these circumstances, the input signal returns from a low level to a high level, the node N0 and the node N1 are maintained at a low level state where there are no existing electrical potential differences between each other since the present state is returned to the initial state, where the first switching element 30 is switched-off and the second switching element 40 is switched-on. Accordingly, in the second case, the pulse is generated when the input signal falls.

Here, if an odd number of inverter(s) is(are) coupled between the node N2 and the input terminal, the state of the node N2 caused by the input signal is opposite to the above case. The switching-on/off operation of the switching elements 30 and 40 according to the input signal is also opposite. Accordingly, a pulse is generated when the input signal rises from a low level to a high level. For the above second case only, power source voltage terminal Vcc instead of the control signal may be connected and in this case a second switching element 40 is not really necessary.

Figure 9:
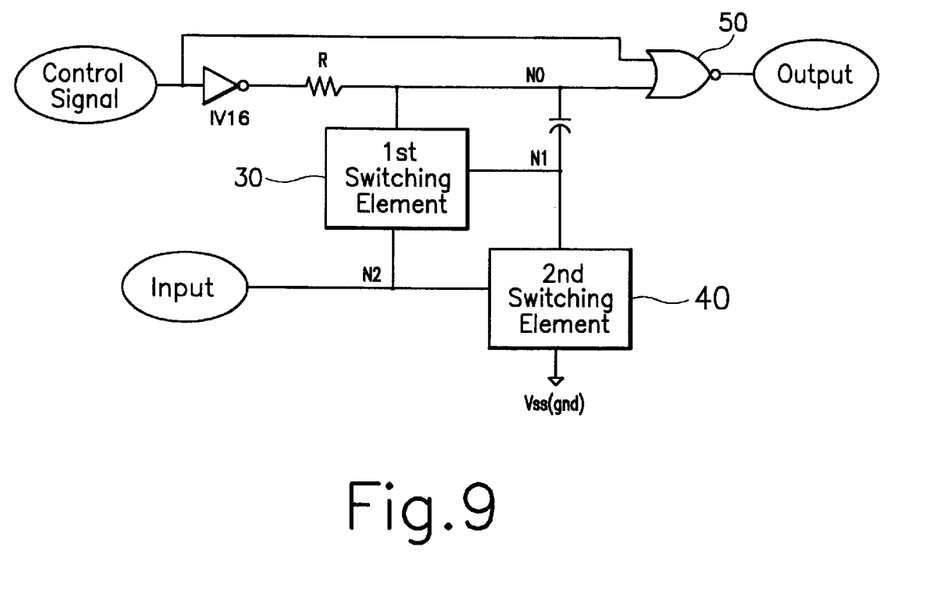
FIG. 9 is a block diagram illustrating a pulse generating apparatus according to a second preferred embodiment of the present invention.

FIG. 9 is a block diagram illustrating a pulse generating apparatus according to a second preferred embodiment of the present invention. In comparing FIG. 6 with FIG. 9, there are differences where the power source voltage terminal Vcc of the first switching element 30 is connected to the output node N0 of a delay circuit including an inverter IV16 and a resistor R, and a NOR gate as a logical operating element where the electrical potential field of the output terminal is maintained at a constant by receiving the control signal and the signal at the node N0 is added.

In FIG. 9, the reason for connecting the power source voltage terminal Vcc of the first switching element 30 to the node N0 is to show that no effect is loaded to the capacitor C since the electrical potential field of the node N1 is maintained at a low level without change, even though the first and the second switching elements 30 and 40 are switched-on/off alternately by the input signal because if the control signal is a high level, the node No becomes a low level.

According to the second preferred embodiment of the present invention, the output terminal maintains a low level and then generates a high pulse in accordance with the input signal, since if the control signal is a low level, the node N0 becomes a high level. But, if the control signal is a high level, the circuit becomes a disable state since the output of the NOR gate 50 becomes a low level.

Figure 10:
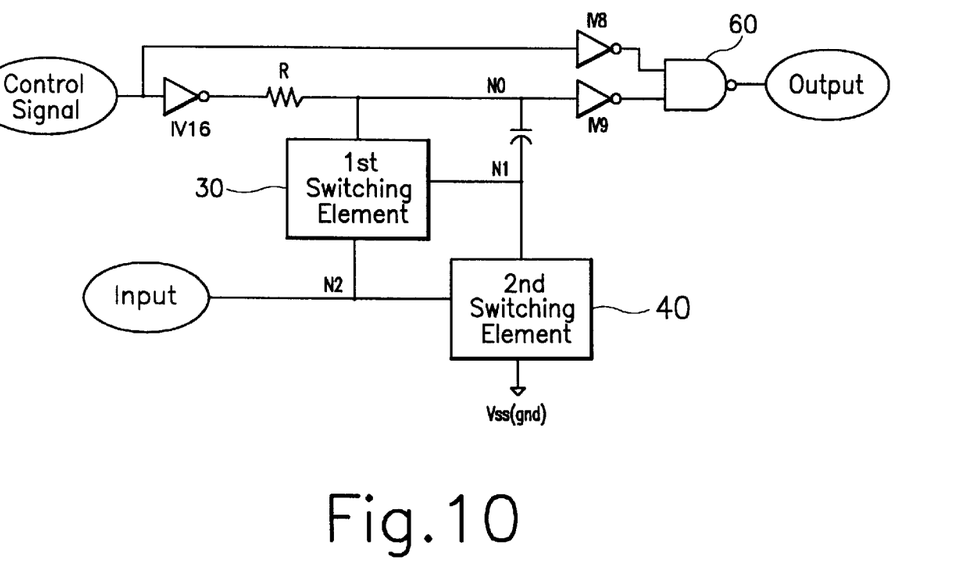
FIG. 10 is a block diagram illustrating a pulse generating apparatus according to a third preferred embodiment of the present invention.

FIG. 10 is a block diagram illustrating a pulse generating apparatus according to a third preferred embodiment of the present invention.

In comparing FIG. 9 with FIG. 10, the difference is that the control signal inverted by adding the inverter IV8 and the signal of the node N0 inverted by adding the inverter IV9 are logically operated by using a NAND gate 60.

According to the third preferred embodiment of the present invention, if the control signal is a low level, the output signal becomes a low pulse, while if the control signal is a high level, the output signal becomes a high level with no relation to the input signal.

Figure 11:
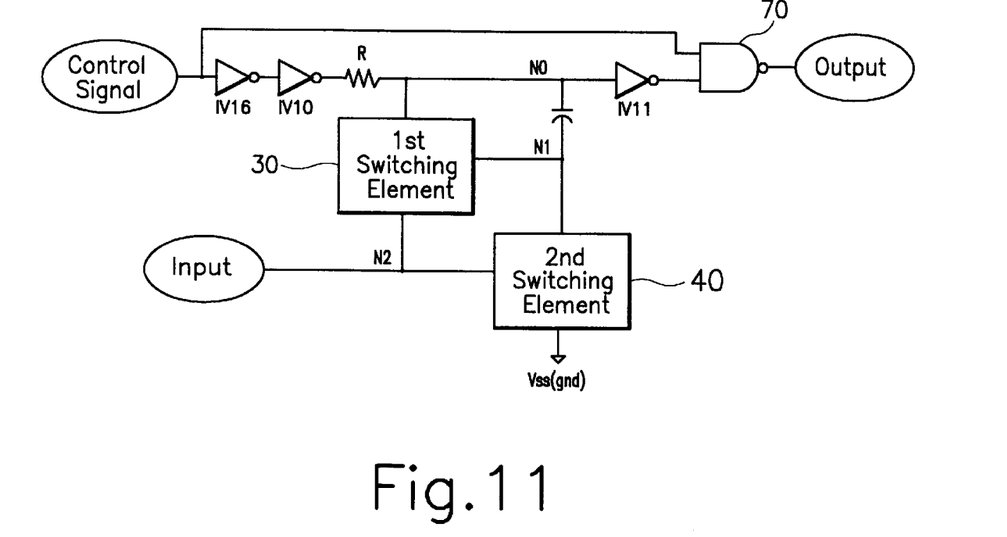
FIG. 11 is a block diagram illustrating a pulse generating apparatus according to a fourth preferred embodiment of the present invention.

FIG. 11 is a block diagram illustrating a pulse generating apparatus according to a fourth preferred embodiment of the present invention.

In comparing FIG. 10 with FIG. 11, there are differences where the control signal is directly inputted to one end of the NAND gate 70 as the logical operating element, and the control signal passes through a delay circuit including three inverters IV10, IV11 and IV16 and resistor R is inputted at the other end of the NAND gate 70.

According to the fourth preferred embodiment of the present invention, if the control signal is a high level, the output signal becomes a low pulse in accordance with the input signal, while if the control signal is a low level, the output signal becomes a high level with no relation to the input signal.

Figure 12:
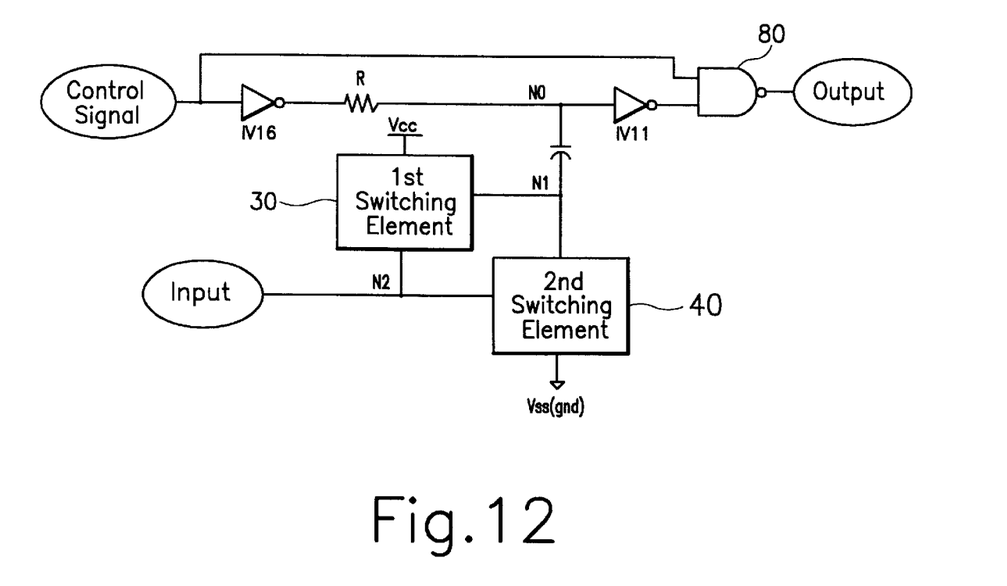
FIG. 12 is a block diagram illustrating a pulse generating apparatus according to a fifth preferred embodiment of the present invention.

FIG. 12 is a block diagram illustrating a pulse generating apparatus according to a fifth preferred embodiment of the present invention.

In comparing FIG. 11 with FIG. 12, there are differences where a NAND gate 80 is the logical operating element whose one terminal receives the control signal directly and the other terminal receives the control signal passed through a delay circuit including an inverter IV16 and the resistor R, is included to maintain the electric potential field at a constant, and the ground voltage terminal of the second switching element 40 is connected to the node N0.

In FIG. 12, the reason for connecting the ground voltage terminal of the second switching element 40 to the node N0 is to show that no effect is not loaded onto the capacitor C, even though the first and the second switching elements 30 and 40 are switched-on/off alternately by the input signal because if the control signal is a low level, the node N0 becomes a high level.

According to the fifth preferred embodiment of the present invention, the output terminal is maintained at a high level and then generates a low pulse in accordance with the input signal because if the control signal is a high level, the node N0 becomes a low level. But, if the control signal is a low level, the circuit becomes a disable state since the output of the NAND gate 80 becomes a high level with no relation to the input signal.

Figure 13:
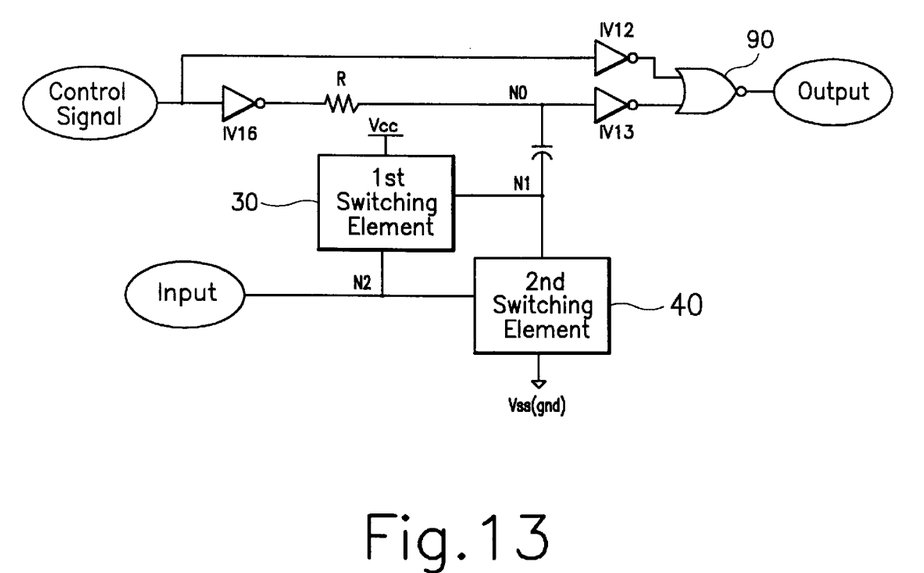
FIG. 13 is a block diagram illustrating a pulse generating apparatus according to a sixth preferred embodiment of the present invention.

FIG. 13 is a block diagram illustrating a pulse generating apparatus according to a sixth preferred embodiment of the present invention.

In comparing FIG. 12 with FIG. 13, there are differences where the logical operating element 90 is the NOR gate whose one terminal receives the control signal through the inverter IV12 and the other terminal receives the control signal passed through a delay circuit including the inverters IV16 and IV13 and the resistor R.

According to the sixth preferred embodiment of the present invention, if the control signal is a high level, the output signal becomes a high pulse with reference to the input signal, while if the control signal is a low level, the output signal becomes a low level with no relation to the input signal.

Figure 14:
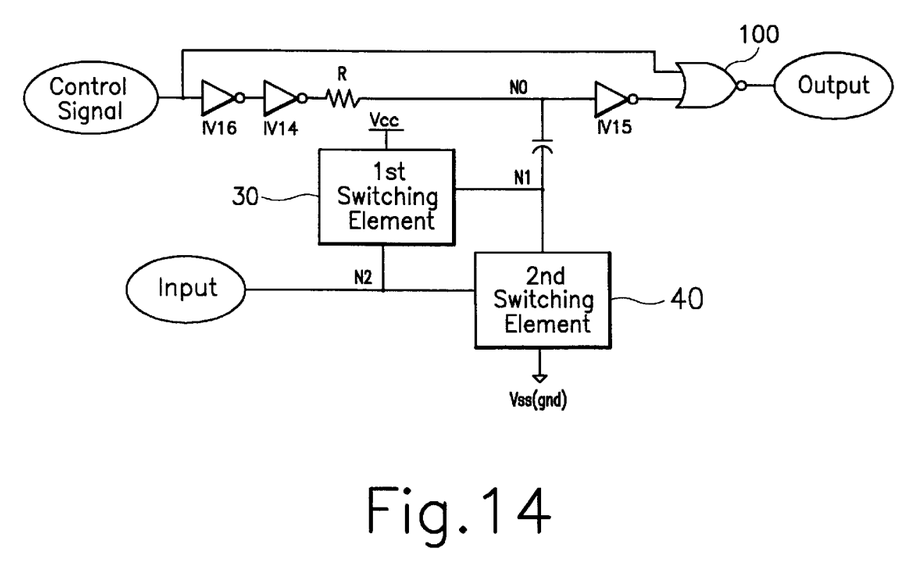
FIG. 14 is a block diagram illustrating a pulse generating apparatus according to a seventh preferred embodiment of the present invention.

FIG. 14 is a block diagram illustrating a pulse generating apparatus according to a seventh preferred embodiment of the present invention.

In comparing FIG. 13 with FIG. 14, there are differences where the logical operating element 100 is the NOR gate whose one terminal receives the control signal directly and the other terminal receives the control signal passed through a delay circuit including the inverters IV14 to IV16 and the resistor R.

According to the seventh preferred embodiment of the present invention, if the control signal is a low level, the output signal becomes a high pulse, while if the control signal is a high level, the output signal becomes a low level with no relation to the input signal.

Many modifications and variations of the present invention are possible in light of the above teachings. Therefore, it is to be understood that within the scope of the appended claims, the invention may be practiced otherwise than as specifically described.

What is claimed is:

1. A pulse generating apparatus outputting a pulse by receiving a first control signal, the apparatus comprising:
   a voltage level control means for receiving said first control signal and outputting a first voltage through a first node;
   an output level variation means placed between said first node and a second node;
   a first switching means for applying a high voltage to said second node; and
   a second switching means for applying a low voltage to said second node;
   wherein said pulse is generated by a logical operation of said first control signal and a voltage at said first node.

2. The pulse generating apparatus according to claim 1, wherein said high voltage is a power source voltage, and said low voltage is a ground voltage.

3. The pulse generating apparatus according to claim 1, wherein said output level variation means is at least a capacitor.

4. The pulse generating apparatus according to claim 1, wherein an operation of both said first and second switching means is controlled by a said second control signal.

5. The pulse generating apparatus according to claim 4, wherein a voltage at said first node is inversed when said high voltage or low voltage is applied to a said second node by said second control signal.

6. The pulse generating apparatus according to claim 4, wherein said second switching means is in a switched-off state when said first switching means is in a switched-on state, and said second switching means is in a switched-on state when said first switching means is in a switched-off state.

7. A pulse generating apparatus outputs a pulse in accordance with receiving a first control signal, the apparatus comprising:
   a voltage level control means for receiving said first control signal and outputting a first voltage through a first node;
   an output level variation means placed between said first node and a second node;

a first switching means for applying a voltage at said first node to said second node; and a second switching means for applying a low voltage to said second node;

wherein said pulse is generated by a logical operation of said first control signal and said voltage at said first node.

8. The pulse generating apparatus according to claim 7, wherein the operation of both said first and second switching means is controlled by a second control signal, said second switching means is in a switched-off state when said first switching means is in a switched-on state, and said second switching means is in a switched-on state when said first switching means is in a switched-off state.

9. A pulse generating apparatus outputting a pulse by receiving a first control signal, the apparatus comprising:

a voltage level control means for receiving said first control signal and outputting a first voltage through a first node;

an output level variation means placed between said first node and a second node;

a first switching means for applying a high voltage to said second node; and a second switching means for applying a voltage at said first node to said second node;

wherein said pulse is generated by a logical operation of said first control signal and said voltage at said first node.

10. The pulse generating apparatus according to claim 9, wherein the operation of both said first and second switching means is controlled by a second control signal, said second switching means is in a switched-off state when said first switching means is in a switched-on state, and said second switching means is in a switched-on state when said first switching means is in a switched-off state.

* * * * *